United States Patent
Waffenschmidt et al.

(10) Patent No.: US 8,786,188 B2
(45) Date of Patent: Jul. 22, 2014

(54) WIRELESS ELECTROLUMINESCENT DEVICE

(75) Inventors: Eberhard Waffenschmidt, Aachen (DE); Willem Franke Pasveer, Dordrecht (NL)

(73) Assignee: Koninklijke Philips N.V., Eindhoven (NL)

(*) Notice: Subject to any disclaimer, the term of this patent is extended or adjusted under 35 U.S.C. 154(b) by 142 days.

(21) Appl. No.: 13/392,119

(22) PCT Filed: Aug. 30, 2010

(86) PCT No.: PCT/IB2010/053877
§ 371 (c)(1),
(2), (4) Date: Feb. 24, 2012

(87) PCT Pub. No.: WO2011/027280
PCT Pub. Date: Mar. 10, 2011

(65) Prior Publication Data
US 2012/0153826 A1 Jun. 21, 2012

(30) Foreign Application Priority Data
Sep. 7, 2009 (EP) .................................. 09169582

(51) Int. Cl.
*H05B 33/26* (2006.01)
*H05B 33/28* (2006.01)

(52) U.S. Cl.
USPC .......................... 315/40; 315/169.3; 313/506

(58) Field of Classification Search
USPC .............. 315/40, 169.1, 169.3; 313/498–512; 257/759
See application file for complete search history.

(56) References Cited

U.S. PATENT DOCUMENTS

| | | | |
|---|---|---|---|
| 6,518,598 B1 | 2/2003 | Chen | |
| 7,994,715 B2 * | 8/2011 | Buchhauser et al. | 313/509 |
| 8,317,561 B2 * | 11/2012 | Sarfert et al. | 445/11 |
| 2008/8842558 | 2/2008 | Buchhauser et al. | |
| 2009/0159677 A1 | 6/2009 | Yakimov et al. | |
| 2012/0153826 A1 * | 6/2012 | Waffenschmidt et al. | 315/40 |

FOREIGN PATENT DOCUMENTS

| | | |
|---|---|---|
| JP | 2007220624 A | 8/2007 |
| WO | 2008012702 A1 | 1/2008 |

* cited by examiner

*Primary Examiner* — Daniel D Chang
(74) *Attorney, Agent, or Firm* — Yuliya Mathis

(57) ABSTRACT

An electroluminescent device (100) comprising a top electrode layer (102) and a bottom electrode layer (104), an electroluminescent layer (106) and an interconnection (108), the interconnection connecting the top and the bottom electrode layers, wherein —the two electrode layers (102,104) are structured as windings; —the electroluminescent layer (106) is located between the two electrode layers; and —the interconnection (108) forms an electrical connection between a first end of the top electrode layer and a second end of the bottom electrode layer.

15 Claims, 3 Drawing Sheets

WIRELESS ELECTROLUMINESCENT DEVICE

FIELD OF THE INVENTION

The present invention relates to the field of electroluminescent devices, and more particularly to organic light emitting diode (OLED) devices.

BACKGROUND

Electroluminescent devices comprise electroluminescent material that is capable of emitting light when a current is passed through it. The material used for electroluminescent devices can be light emitting polymers or small organic molecules. Organic devices may, for example be organic light emitting diodes (OLEDs), which are known in the art. For activating the electroluminescent devices, current is applied to the electroluminescent material by means of electrodes.

Electroluminescent devices, such as OLEDs, comprise electroluminescent material disposed between electrodes. Upon application of a suitable voltage, current flows through the electroluminescent material from anode to cathode. Light is produced by radiative recombination of holes and electrons inside the electroluminescent material.

SUMMARY OF THE INVENTION

The present invention provides an electroluminescent device with a wireless power supply. Therefore, the electroluminescent device comprises a first and a second electrode layer, an electroluminescent layer and an interconnection. The interconnection connects the first and the second electrode layer.

According to embodiments of the invention the two electrode layers are structured as windings. This is advantageous because the electrode layers can be used as inductive power receivers. The electroluminescent layer is located between the two electrode layers. The interconnection forms an electrical connection between the first electrode layer and the second electrode layer. Preferably, the electroluminescent layer has a thickness of 100 nm-1 μm and the distance between the two electrode layers ranges from 10 μm to 200 μm. The electroluminescent layer can be a non-structured layer covering the complete electrode area and the areas between the windings or alternatively a structured layer.

According to embodiments of the invention the interconnection forms an electrical connection between a first end of the first electrode layer and a second end of the second electrode layer.

According to embodiments of the invention an AC voltage is induced into the electrode layers by an electromagnetic field. The induced voltage is applied to the electroluminescent layer being located between the two electrode layers. Thus, the first and the second electrode layer are adapted for applying a voltage on the electroluminescent layer. Because the electroluminescent device acts as a diode and blocks the current in reverse direction, only during one of the half waves a current flows. Thus, the AC frequency has to be high enough to avoid flickering, e.g. larger than 100 Hz. Preferably, the AC frequency is in the kHz, MHz or even GHz region. It is to be noted that the frequency equals preferably the resonance frequency of the windings.

According to embodiments of the invention the first end of the first electrode layer and the first end of the second electrode layer are located opposite to each other. As the interconnection connects the first end of the first electrode layer and the second end of the second electrode layer, the interconnection connects two ends of the electrode layers that are not located opposite to each other. This is advantageous because in this way a homogenous electromagnetic field in the electroluminescent layer can be achieved.

According to embodiments of the invention the second end of the first electrode layer and the second end of the second electrode layer are located opposite to each other. This is advantageous because a homogenous electromagnetic field can be induced in the electroluminescent layer.

According to embodiments of the invention each electrode has a winding origin and a peripheral winding. The winding origin is preferably located in the middle of the electrode. The peripheral winding is located by definition in the peripheral region of the electrode. The first end of each electrode is the winding origin and the second end of each electrode is the end of the peripheral winding. Thus, the winding origin of the first electrode is connected to the end of the peripheral winding of the second electrode by the interconnection.

According to embodiments of the invention each electrode has a winding origin and a peripheral winding. The first end of the first electrode is the winding origin and the second end of the second electrode is also the winding origin. Thus, the interconnection connects the winding origin of the first electrode with the winding origin of the second electrode. In this case the two electrode windings have opposite orientations. One electrode is structured as clockwise windings and the other electrode is structured as anticlockwise windings. The antiparallel windings induce an electromagnetic field in the electroluminescent layer.

According to embodiments of the invention the first and the second electrodes are adapted for inducing a constant electromagnetic field into the electroluminescent layer.

According to embodiments of the invention the electroluminescent layer is an organic light emitting diode (OLED).

According to embodiments of the invention the electroluminescent layer is structured. This is advantageous because shortcuts are avoided, especially for electroluminescent layers with a very good conducting and/or thick electroluminescent layers in combination with narrowly arranged windings of the electrodes.

According to embodiments of the invention the electroluminescent layer is structured as windings.

According to embodiments of the invention the interconnection comprises a component for changing the resonance frequency of the windings. The resonance frequency of the windings is a frequency, where the efficiency of the wireless power supply has its highest value. By adapting the resonance frequency for example interferences can be minimized. Thus, by applying a component for changing the resonance frequency the degree of efficiency can be optimized. The component can for example be a capacitor.

The capacitor can be connected in series to the interconnection of the first and the second electrode. For example, a small sized capacitor (e.g. SMD 0201) can be used as vertical contact from top to bottom electrode. This capacitor acts as series resonant capacitor and can improve the power reception.

According to embodiments of the invention the electroluminescent device is located on a substrate. For example, the substrate is glass, plastic or foil.

According to embodiments of the invention the electrodes are made of transparent material like indium tin oxide (ITO).

According to embodiments of the invention the housing of the OLED must be non-conducting. Else, the AC electromagnetic field would induce eddy currents in the housing and the power transmission would be severely disturbed. At least one side of the electroluminescent layer is transparent. For some applications, it may not be necessary to have the whole device transparent. In this case, one side may be non-transparent. The electrodes on this side may also be non-transparent. Preferably, this is the side with the interconnection.

The electroluminescent device has a rather high capacity. By selecting the appropriate number of turns and the inductance of the coil can be designed such that it is in resonance with this capacity at operating frequency. This way, the power transmission can be optimized.

To compensate for inhomogeneous current distributions, the width of the individual windings may be varied.

In another aspect the invention relates to an illuminating apparatus comprising a plurality of embodiments of electroluminescent devices.

In another aspect the invention relates to a system comprising an electroluminescent device and an inductor. The inductor is adapted to establish an electromagnetic field in the region of the electroluminescent device. For inducing an AC voltage into the electroluminescent device, the inductor changes the direction of the electromagnetic field regularly. Thus, the electromagnetic field induces an AC voltage in the electroluminescent device. Thereby, the inductor provides a wireless power supply to the electroluminescent device.

According to embodiments of the invention the electromagnetic field's frequency, which supplies the electroluminescent device with power, is in the radio frequency range, i.e. 3 MHz-3 GHz.

According to embodiments of the invention the electromagnetic field's frequency, which supplies the electroluminescent device with power, is in the range of 50 kHZ-500 kHZ.

The system can for example be used to illuminate a window or any other surface. In a window the electroluminescent device is preferably transparent. Therefore, the electrodes have to be made of a transparent material, for example ITO. When the electroluminescent device is supplied with power, the electroluminescent layer emits light. The wireless power supply is realized by the inductor, which can for example be located in the window frame or in any other place, where it does not appear to the user's eye. The efficiency of the wireless power supply depends on the distance between the inductor and the electroluminescent device, the size of the inductor and the electromagnetic field established by the inductor.

In another aspect the invention relates to a method of producing an electroluminescent device. The electroluminescent device comprises a first and a second electrode layer, an electroluminescent layer and an interconnection. The interconnection connects the first and the second electrode layer. The two electrode layers are structured as windings. The electroluminescent layer is located between the two electrode layers and the interconnection forms an electrical connection between the first end of the first electrode layer and a second end of the second electrode layer.

BRIEF DESCRIPTION OF THE DRAWINGS

In the following embodiments of the invention are described in greater detail by way of example only making reference to the drawings in which.

DETAILED DESCRIPTION OF THE DRAWINGS

Figure 1:
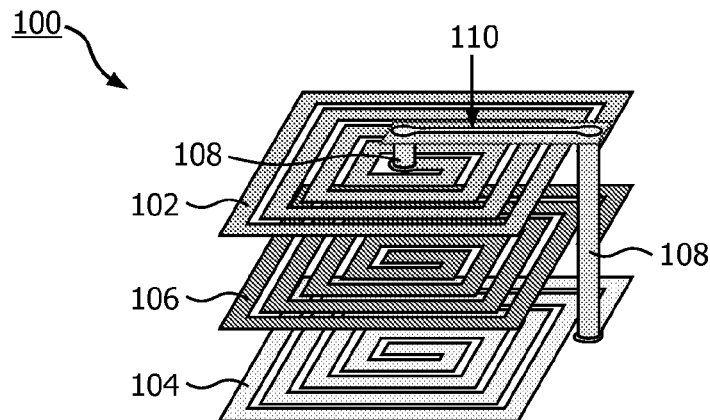
FIG. 1 shows as schematic view of an electroluminescent device with two electrodes and an interconnection.

FIG. 1 shows a schematic view of an embodiment of an electroluminescent device 100. The electroluminescent device 100 comprises a top electrode 102, a bottom electrode 104, an electroluminescent layer 106, an interconnection 108 and an insulation layer 110.

The electroluminescent layer 106, the top electrode 102 and the bottom electrode 104 are structured as clockwise windings. As an alternative, anti-clockwise windings can also be used. The electroluminescent layer 106 is located between the top electrode 102 and the bottom electrode 104. The interconnection 108 connects the top electrode 102 with the bottom electrode 104. The origin of the windings of top electrode 102 is connected with the interconnection 108 to the end of the peripheral winding of bottom electrode 104. The insulation layer 110 insulates other parts of the top electrode 102 from the interconnection 108 for avoiding a short circuit.

In operation, an AC voltage is induced into the windings of the top electrode 102 and the bottom electrode 104. Because the end of the peripheral winding of the bottom electrode 104 is connected with the origin of the windings of the top electrode 108, a short circuit is established between these two points. Thus, the applied voltages at these points is 0 volts. Depending on the direction of the electromagnetic field the voltage in the windings increases or decreases from the origin of the windings to the end of the peripheral winding.

If, for example, the voltage decreases from the origin of the windings to the end of the peripheral winding, the induced voltage in the top electrode 102 decreases from 0 volts in the origin of the windings to the maximum negative value on the end of the peripheral winding. The maximum value depends on the power of the electromagnetic field. The voltage in the bottom electrode 104 increases from 0 volts on the end of the peripheral winding up to the maximum value in the origin of the windings. Thus, there is a constant voltage between the top electrode 102 and the bottom electrode 104, the maximum voltage induced by the electromagnetic field.

Because a homogeneous voltage is applied between the two electrodes, the electroluminescent layer homogeneously emits light. A short circuit is avoided by the winded structure of the electroluminescent layer. To avoid shortcuts the electroluminescent layer 106 has to be a good conductor in the direction from one electrode to the other electrode, and a bad conductor in the perpendicular direction. This is achieved by the structured electroluminescent layer 106 in FIG. 1. Alternatively a non-structured contiguous electroluminescent layer can also be applied without risks of shorts, if the thickness of the electroluminescent layer is significantly smaller than the distance between neighbored windings of the electrodes. A typical thickness of the electroluminescent layer is 100 nm, The distance between neighbored windings can be adjusted to be at least 1 mm. For electroluminescent layers with a homogeneous conductivity, the electrical path from one electrode to the opposite electrode is about 10000 times shorter than the electrical path from a winding to its neighbored winding of one electrode assuring that the current will flow between both electrodes and no short occurs between neighbored winding of one electrode.

Figure 2A:
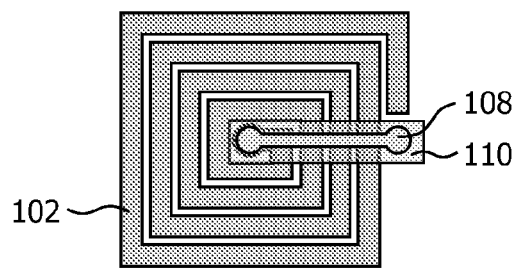
FIG. 2a shows a schematic view of a top electrode of an electroluminescent device.

FIG. 2a shows a schematic view of a top electrode 102, the insulation layer 110 and the interconnection 108 in a top view. In operation a voltage is induced by an electromagnetic field. For example, the voltage decreases from 0 volts in the origin of the windings to −0.5 volts on the end of the peripheral winding.

Figure 2B:
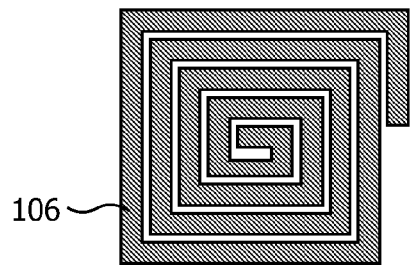
FIG. 2b shows a schematic view of an electroluminescent layer of an electroluminescent device.

FIG. 2b shows a schematic view of an electroluminescent layer 106. The electroluminescent layer is structured as windings in order to avoid short circuits. In operation, a voltage is applied to the electroluminescent layer. When a voltage is applied on the electroluminescent layer 106, the electroluminescent layer 106 emits light. The voltage is applied to the electroluminescent layer 106 by the two electrodes 102 and 104. An AC voltage is induced into the two electrodes 102 and 104 by an electromagnetic field. Only during one of the half waves a current may flow because the electroluminescent device acts as a diode and blocks the current in reverse direction.

Figure 2C:
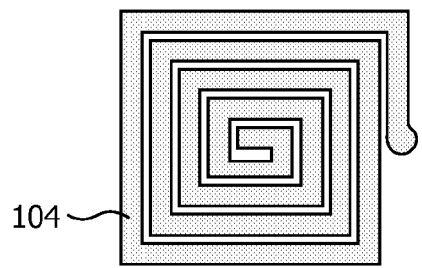
FIG. 2c shows a schematic view of a bottom electrode of an electroluminescent device.

FIG. 2c shows a schematic view of a bottom electrode 104. The bottom electrode 104 is structured as clockwise windings parallel to the windings of the top electrode 102 and the electroluminescent layer 106. The induced voltage in the windings of the electrodes is applied as voltage between the top electrode 102 and the bottom electrode 104.

In FIGS. 2a-c, the top and the bottom electrode are from a transparent conductor material, e.g. ITO (indium tin oxide). The layer between the electrodes is the OLED. It is also structured as winding, because otherwise the OLED might create a short circuit between the windings. The figures also show an interconnection from the centre of the top electrode to the outside of the lower electrode. This is also made from a transparent conductor, e.g. ITO.

Figure 3:
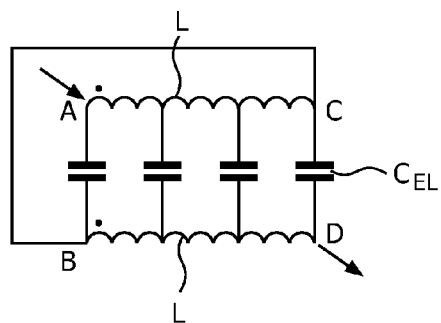
FIG. 3 shows a schematic view of an equivalent circuit of an electroluminescent device with parallel windings.

FIG. 3 shows a schematic view of a circuit of an electroluminescent device 100. The two electrodes are represented as coils with the inductance L. The electroluminescent layer being located between the two electrodes is represented as a plurality of capacitors $C_{EL}$. The four points A, B, C and D represent the four ends of the two electrodes. A and B are located in the origin of the windings. C and D are located at the end of the peripheral windings. C is connected to B, which means that these two points have the same potential. The induced voltage is applied between B and D, and C and A. The distributed capacitors $C_{EL}$ represent the OLED, which also has a remarkable capacitive contribution.

Figure 4:
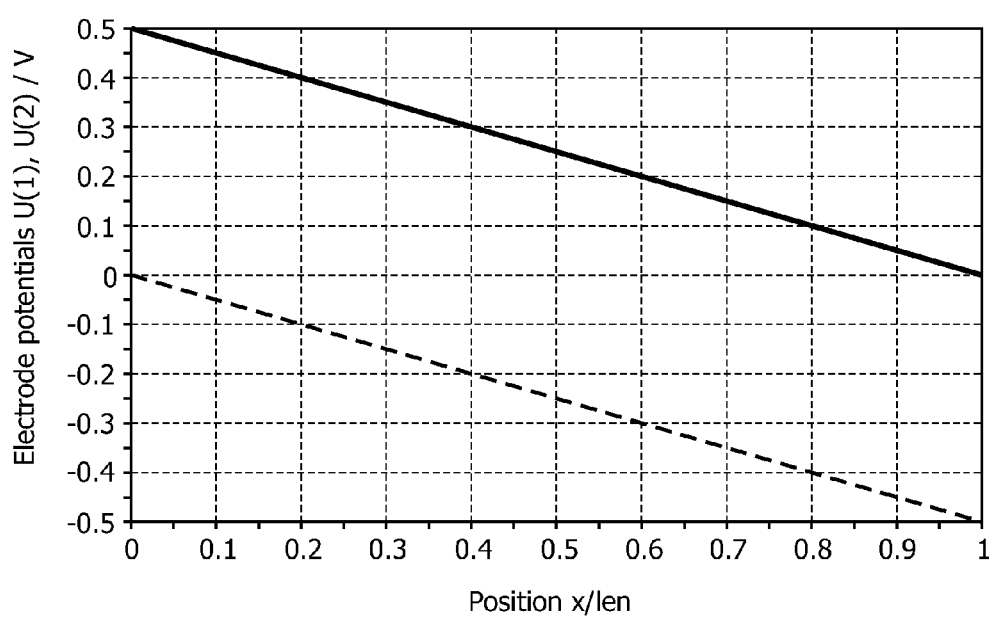
FIG. 4 shows a diagram of the voltage of the electrodes of an electroluminescent device with parallel windings.

FIG. 4 shows a diagram of the voltages of the two electrodes of the electroluminescent device. The x-axis represents the position on the electrodes as a fraction of the total length of the electrode. This means, 0 is the origin of the windings and 1 is the end of the peripheral winding. The y-axis represents the electrode potential. The dashed line is the voltage of the top electrode 102, while the solid line represents the voltage in the bottom electrode 104. Both lines are idealized voltage slopes, but they illustrate the principle.

By connecting inner and outer edge of the windings, the voltage between the electrodes at each point is equal to the voltage induced over the length of the winding. In this case an inductor induces a voltage of 0.5 volts into each electrode. This leads to a voltage difference between both electrodes at every point of the electroluminescent device of 0.5 volts.

By connecting inner and outer edge of the windings, the voltage between the electrodes at each point is equal to the voltage induced over the length of the winding.

The induced voltage is an AC voltage. Only during one of the halve-waves a current may flow, because the OLED acts as diode and blocks the current in reverse direction. The series resistance of the ITO can act as shunt resistor to limit the current.

Figure 5:
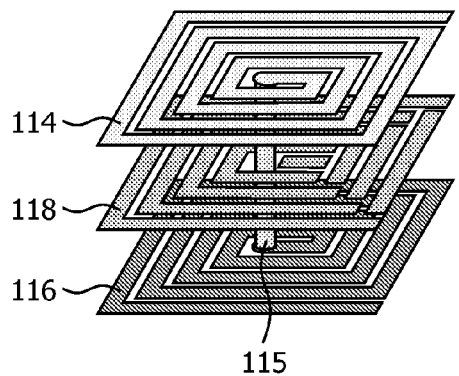
FIG. 5 shows a schematic view of an electroluminescent device with anti-parallel winded electrode layers.

FIG. 5 shows a schematic view of an electroluminescent device 112 with anti-parallel winding structures. The windings of the top electrode 114 are directed clockwise, while the windings of the bottom electrode 116 are directed anti-clockwise. Interconnection 115 connects the origin of the windings of top electrode 114 with the origin of the windings of bottom electrode 116. The structured electroluminescent layer 118 is located between the two electrodes. While the top electrode 114 is structured as clockwise windings, the bottom electrode 116 is structured as anticlockwise windings. The electroluminescent layer 118 is structured such that short circuits are avoided. Therefore, the windings are interrupted regularly.

In operation, an AC voltage is induced into the top electrode 114 and into the bottom electrode 116. Because of the interconnection 115 the origins of the two electrodes are short circuited, this means that no voltage is applied to the electroluminescent device 118 in the middle, where the origins of the windings are located. The advantage of such an electroluminescent device with anti-parallel windings is the easier way of production. No additional layer for the interconnection 115 is required. The short circuits are avoided by the structure of the electroluminescent device 118.

The electroluminescent device will have a dark spot in the middle because of the interconnection 115 and the brightness of the electroluminescent device is not homogeneous, because the voltage between the two electrodes is not constant.

As an alternative, the interconnection connects the end of the peripheral winding of the top electrode with the end of the peripheral winding of the bottom electrode. The dark spot would then be at end of the peripheral windings.

As a further alternative, the interconnection connects the top and the bottom electrode layer at a point being located on the windings. This means, the interconnection is not necessarily located at one of the ends of the top and/or the bottom electrode layer. The point of the interconnection may be located anywhere on the windings of the top and the bottom electrode. The dark spot would then be at this point.

Figure 6A:
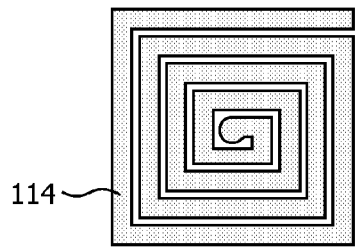
FIG. 6a shows a schematic view of the top electrode of an electroluminescent device.

FIG. 6a shows a schematic view of a top electrode 114 with clockwise windings. In operation, for example, the voltage decreases from the origin of the windings to the end of the peripheral winding.

Figure 6B:
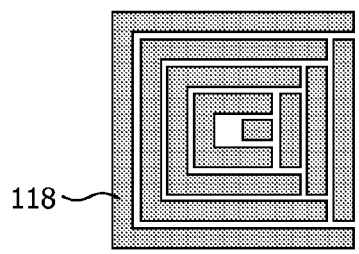
FIG. 6b shows a schematic view of an electroluminescent layer of an electroluminescent device.

FIG. 6b shows a schematic view of an electroluminescent layer 118, which is structured in windings with a plurality of gaps. The gaps are located regularly in the right side of the electroluminescent layer 118. The distances between the gaps increases with the distance from the origin of the windings. The plurality of different structures of the electroluminescent layer 118 can be applied. The gaps avoid short circuits between the two electrodes. It is necessary that the electroluminescent layer is a good conductor in the direction from one electrode to the other and a bad conductor in the perpendicular direction.

Figure 6C:
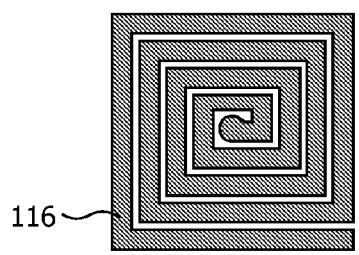
FIG. 6c shows a schematic view of the bottom electrode of an electroluminescent device.

FIG. 6c shows a schematic view of a bottom electrode 116 with anticlockwise structured windings. By structuring the windings anti-parallel to the windings of the top electrode 114, a voltage is applied between the two electrodes on every point of the windings but the connection point in the origin of the windings. This means that the electroluminescent layer 118 emits light at every point but at the middle, where the interconnection 115 is located. The voltage between the two electrodes is not constant. If, for example the electromagnetic field induces a negative voltage into the windings, the voltage in the windings decreases from 0 volts in the origin of the windings to the maximum value at the end of the peripheral winding. This means, the structures of the top electrode 114 and the bottom electrode 116 have to be wisely adapted in order to apply a voltage as homogeneous as possible to the electroluminescent device 118.

Figure 7:
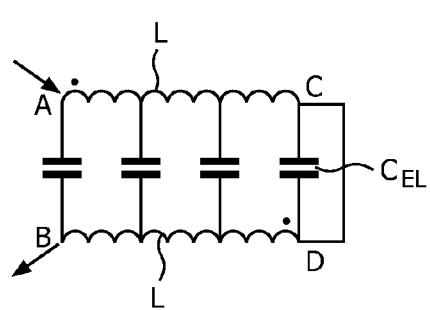
FIG. 7 shows a schematic view of an equivalent circuit of an electroluminescent device with anti-parallel windings.

FIG. 7 shows a schematic view of an equivalent circuit of the electroluminescent device according to FIG. 5. The points A, B, C, D represent points on the windings of the electrodes. Points A and B are the ends of the peripheral windings, while C and D are points at the origin of the windings of the electrodes. C and D are connected by the interconnection. The electrode layers are represented as a coil with the inductance L and the electroluminescent device is represented as a plurality of capacities $C_{el}$.

In operation, an electromagnetic field induces an AC voltage into the coils with the inductance L such that a voltage is applied between the two coils. The electroluminescent device represented by the capacitors then emits light.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

| List of Reference Numerals | |
|---|---|
| 100 | Electroluminescent device |
| 102 | Top electrode layer |
| 104 | Bottom electrode layer |
| 106 | Electroluminescent layer |
| 108 | Interconnection |
| 110 | Insulation layer |
| 112 | Electroluminescent device |
| 114 | Top electrode layer |
| 115 | Interconnection |
| 116 | Bottom electrode layer |
| 118 | Electroluminescent layer |

The invention claimed is:

1. An electroluminescent device comprising a first electrode and a second electrode, an electroluminescent layer and an interconnection, the interconnection connecting the first electrode and the second electrode, wherein
the first and second electrodes being structured as windings;
the electroluminescent layer being located between the two electrodes; and
the interconnection forming an electrical connection between the first electrode and the second electrode.

2. The electroluminescent device of claim 1, wherein the interconnection connects a first end of the first electrode with a second end of the second electrode.

3. The electroluminescent device of claim 1, wherein the first electrode and the second electrode are adapted for inducing an electromagnetic field into the electroluminescent layer.

4. The electroluminescent device of claim 3, wherein the first end of the first electrode and the first end of the second electrode are located opposite to each other.

5. The electroluminescent device of claim 4, wherein the second end of the first electrode and the second end of the second electrode are located opposite to each other.

6. The electroluminescent device of claim 5, wherein each of the electrodes has a respective winding origin and a respective peripheral winding, wherein the first end of the first electrode is the winding origin of the first electrode, the first end of the second electrode is the winding, origin of the second electrode, the second end of the first electrode is the peripheral winding of the first electrode, and the second end of the second electrode is the peripheral winding of the second electrode.

7. The electroluminescent device of claim 2, wherein each of the electrodes has a respective winding origin and a respective peripheral winding, wherein the first end of the first electrode is the winding origin of the first electrode and the second end of the second electrode is the winding origin of the second electrode.

8. The electroluminescent device of claim 1, wherein the electroluminescent layer is an organic light emitting diode.

9. The electroluminescent device of claim 1, wherein the electroluminescent layer is structured.

10. The electroluminescent device of claim 1, wherein the electroluminescent layer is structured as windings.

11. The electroluminescent device of claim 10, wherein the interconnection comprises a component for changing the resonance frequency of the windings.

12. The electroluminescent device of claim 1, wherein the electroluminescent device is located on a substrate, wherein the substrate comprises glass, plastic or foil.

13. An illuminating apparatus comprising a plurality of electroluminescent devices of claim 1.

14. A system comprising an electroluminescent device according to claim 1 and an inductor, wherein the inductor is adapted to establish an electromagnetic field in the region of the electroluminescent device, wherein the electromagnetic field induces a current in the electroluminescent device.

15. A method of producing an electroluminescent device, the electroluminescent device comprising a first electrode and a second electrode, an electroluminescent layer and an interconnection, the interconnection connecting the first electrode and the second electrode, wherein
the first and second electrodes being structured as windings;
the electroluminescent layer being located between the two electrodes; and
the interconnection forming an electrical connection between the first electrode and the second electrode.

\* \* \* \* \*